С010819036B2

United States Patent
Ma et al.

(10) Patent No.: US 10,819,036 B2
(45) Date of Patent: *Oct. 27, 2020

(54) DIELECTRIC RESONANT ANTENNA BASED NMOSFET TERAHERTZ DETECTOR AND METHOD

(71) Applicant: Guangdong University of Technology, Guangzhou (CN)

(72) Inventors: Jianguo Ma, Guangzhou (CN); Shaohua Zhou, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/297,692

(22) Filed: Mar. 10, 2019

(65) Prior Publication Data
US 2020/0203843 A1 Jun. 25, 2020

(30) Foreign Application Priority Data

Dec. 24, 2018 (CN) .......................... 2018 1 1581762

(51) Int. Cl.
*H01Q 1/22* (2006.01)
*H01Q 13/18* (2006.01)
(Continued)

(52) U.S. Cl.
CPC ............ *H01Q 13/18* (2013.01); *G06F 30/20* (2020.01); *G06F 30/39* (2020.01); *H01L 23/66* (2013.01);
(Continued)

(58) Field of Classification Search
CPC . H01Q 1/50; H01Q 5/10; H01Q 11/12; H01Q 1/2283; H01Q 13/18
(Continued)

(56) References Cited

U.S. PATENT DOCUMENTS 5,913,154 A * 6/1999 Wynn ....................... H03F 1/34
330/127
7,595,766 B2 * 9/2009 Rofougaran ......... H01Q 1/2283
343/795
(Continued)

FOREIGN PATENT DOCUMENTS

CN 103762420 A 4/2014
CN 105300530 A 2/2016
(Continued)

OTHER PUBLICATIONS

First Office Action to the corresponding CN application No. 201811581762.X, dated Feb. 6, 2020, 7 pages total.

*Primary Examiner* — Tung X Le (57) ABSTRACT

The present disclosure discloses a dielectric resonant antenna based NMOSFET terahertz detector, comprising an on-chip dielectric resonant terahertz antenna, wherein the on-chip dielectric resonant terahertz antenna is connected to a matching network, the matching network is connected to a source of an NMOSFET, and a gate of the NMOSFET is sequentially connected to a first bias resistor and a first bias voltage, a third transmission line is connected between the first bias resistor and the gate, a drain of the NMOSFET is connected to a first DC blocking capacitor, the other end of the first DC blocking capacitor is connected to a low noise preamplifier, a second bias resistor and a second bias voltage
(Continued)

are connected in parallel between the first DC blocking capacitor and the low noise preamplifier, and the low noise preamplifier is further provided with a voltage feedback loop. The present disclosure also discloses a design method for the same.

6 Claims, 5 Drawing Sheets (51) Int. Cl.
    *G06F 30/20*     (2020.01)
    *G06F 30/39*     (2020.01)
    *H01L 23/66*     (2006.01)
    *H03F 3/45*     (2006.01)
    *H01P 1/24*     (2006.01)

(52) U.S. Cl.
    CPC ....... *H01Q 1/2283* (2013.01); *H03F 3/45475* (2013.01); *H01L 2223/6627* (2013.01); *H01L 2223/6677* (2013.01); *H01P 1/24* (2013.01); *H03F 2200/129* (2013.01); *H03F 2200/294* (2013.01); *H03F 2203/45116* (2013.01); *H03F 2203/45528* (2013.01)

(58) Field of Classification Search
    USPC ........................................ 343/850, 860, 865
    See application file for complete search history.

(56) References Cited

U.S. PATENT DOCUMENTS

| | | | | |
|---|---|---|---|---|
| 7,859,474 | B1* | 12/2010 | Cripe | H03H 11/30 |
| | | | | 330/127 |
| 9,300,038 | B2* | 3/2016 | Burgener | H03H 9/0014 |
| 2007/0018903 | A1* | 1/2007 | Mohamadi | H03F 3/604 |
| | | | | 343/853 |
| 2007/0222697 | A1* | 9/2007 | Caimi | H01C 21/50 |
| | | | | 343/861 |
| 2008/0158090 | A1* | 7/2008 | Dupont | H03H 7/487 |
| | | | | 343/850 |
| 2009/0046030 | A1* | 2/2009 | Song | H03J 3/06 |
| | | | | 343/852 |
| 2011/0248900 | A1* | 10/2011 | de Rochemont | H01Q 5/15 |
| | | | | 343/803 |
| 2014/0266477 | A1 | 9/2014 | Sekiguchi et al. | |

FOREIGN PATENT DOCUMENTS

| | | |
|---|---|---|
| CN | 106229644 A | 12/2016 |
| CN | 107959118 A | 4/2018 |
| CN | 108180931 A | 6/2018 |
| CN | 108332863 A | 7/2018 |

* cited by examiner

Fig.7

DIELECTRIC RESONANT ANTENNA BASED NMOSFET TERAHERTZ DETECTOR AND METHOD

CROSS-REFERENCE TO RELATED APPLICATION

This application claims the priority to Chinese Patent Application No. 201811581762.X filed on Dec. 24, 2018. The content of the aforementioned application, including any intervening amendments thereto, are incorporated herein by reference.

TECHNICAL FIELD

The present disclosure relates to the field of terahertz technology, and in particular to a dielectric resonant antenna based N-type Metal-Oxide-Semiconductor Field-Effect Transistor (NMOSFET) terahertz detector and method.

BACKGROUND

Terahertz (THz) usually refers to electromagnetic waves with a frequency of 0.1 to 10 THz (wavelength of 0.03 to 3 mm). The long-wavelength band thereof coincides with the millimeter wave (submillimeter wave), and its development mainly relies on electronic science and technology. The short-wavelength band thereof coincides with the infrared ray, and its development mainly relies on the science of photonics. It can be seen that the terahertz wave is at the frequency band for the transition from macro-electronics to micro-photonics. Therefore, it occupies a special position in the electromagnetic spectrum, but the electromagnetic wave in the terahertz band has not been fully studied and applied for a long time due to the lack of effective terahertz radiation generation and detection methods, and thus is called "THz gap" in the electromagnetic spectrum.

Recently, terahertz detection based on NMOSFET has proved to be very feasible, but due to complementary metal oxide semiconductor (CMOS) process limitations, the larger loss of conventional terahertz antennas such as on-chip dipoles and patches in terahertz detectors leads to the significantly reduced gain and radiation efficiency of the conventional terahertz antenna such as on-chip dipoles and patches, which greatly affects the detection efficiency and detection sensitivity of the NMOSFET terahertz detector.

At present, the on-chip terahertz antennas in the terahertz detectors are developing toward low loss, high gain and high radiation efficiency. Thus, developing a new on-chip terahertz antenna based on CMOS compatible process capable of achieving low loss, high gain and high radiation efficiency, is the current research hotspot. At the same time, the biggest difference between the conventional terahertz antenna such as a on-chip dipole and a patch and the on-chip terahertz dielectric resonant antenna is that the dielectric resonator block in the on-chip terahertz dielectric resonant antenna has low loss characteristics, so it can effectively improve the problem of large loss of the on-chip terahertz antenna. In addition, the dielectric resonant antenna has been proved to be applicable to the on-chip terahertz antenna design. The electromagnetic energy in the space can be coupled to the dielectric resonator block with low loss characteristics through an on-chip structure, which can effectively improve the problem of large loss of the on-chip terahertz antenna, greatly increasing the radiation efficiency and gain of the on-chip terahertz antenna.

The present disclosure innovatively introduces an on-chip dielectric resonant terahertz antenna into an NMOSFET-based terahertz detector, and achieves lower loss of the on-chip terahertz antenna, and higher gain and radiation efficiency of the on-chip terahertz antenna in comparison with conventional NMOSFET terahertz detectors based on terahertz antennas such as on-chip dipoles and patches.

SUMMARY

A main object of the present disclosure is to provide an NMOSFET terahertz detector and method based on a dielectric resonant antenna, which is intended to reduce the loss of the on-chip terahertz antenna and improve the gain and radiation efficiency of the on-chip terahertz antenna, improving the detection efficiency and detection sensitivity of the NMOSFET terahertz detector.

To achieve the above object, the present disclosure proposes a dielectric resonant antenna based NMOSFET terahertz detector, comprising an on-chip dielectric resonant terahertz antenna, wherein the on-chip dielectric resonant terahertz antenna is connected to a matching network, the matching network is connected to a source of an NMOSFET, a gate of the NMOSFET is sequentially connected to a first bias resistor and a first bias voltage, a third transmission line is connected between the first bias resistor and the gate, a drain of the NMOSFET is connected to a first Direct Current (DC) blocking capacitor, the other end of the first DC blocking capacitor is connected to a low noise preamplifier, a second bias resistor and a second bias voltage are further connected in parallel between the first DC blocking capacitor and the low noise preamplifier, and the low noise preamplifier is further provided with a voltage feedback loop.

Preferably, the on-chip dielectric resonant terahertz antenna comprises an on-chip H-shaped slot structure and a rectangular dielectric resonator block connected to the on-chip H-shaped slot structure at the surface by an insulating adhesive layer.

Preferably, the on-chip H-shaped slot structures are formed on a surface of an integrated process top layer metal and is located within a metal cavity formed by stacking intermediate layer metals, other than the integrated process top layer metal and an integrated process bottom layer metal in an integrated process, and metal vias.

Preferably, the on-chip H-shaped slot structure comprises a left vertical slot and a right vertical slot arranged in parallel, opposite sides of the left vertical slot and the right vertical slot are connected to an inverted L-shaped left side slot and right side slot, respectively.

Preferably, a horizontal portion of the left side slot is connected in the middle of the left vertical slot, a horizontal portion of the right side slot is connected in the middle of the right vertical slot, and vertical portions of the left side slot and the right side slot are parallel to each other and constitute two lead-out slots for connecting the antenna to an outside structure.

Preferably, the matching network comprises a first transmission line connected to the on-chip dielectric resonant terahertz antenna and the source respectively at both ends, a middle portion of the first transmission line is connected to one end of a second transmission line, and the other end of the second transmission line is grounded.

Preferably, the voltage feedback loop comprises a first resistor connected to two ends of the low noise preamplifier, a left end of the first resistor connected to a negative terminal of the low noise preamplifier is sequentially connected to a second resistor, a second DC blocking capacitor and the ground, and a right end of the first resistor is also sequentially connected to a third DC blocking capacitor and the ground.

The present disclosure further proposes a method of designing the on-chip dielectric resonant terahertz antenna, comprising steps of:

S1: with a resonance mode being in $TE_{m,\delta,n}$ mode, calculating 3D dimensions of the rectangular dielectric resonator block by solving a transcendental equation, the transcendental equation being:

$$k_y \tan\left(\frac{k_y W_{DRA}}{2}\right) = \sqrt{(\varepsilon_r - 1)k_{mn}^2 - k_y^2} \quad (1)$$

where c is the speed of light, and $f_{mn}$ is the operating frequency of the rectangular dielectric resonator block in this mode;

S2: in a process of designing an on-chip excitation structure, selecting a top layer metal Metal6 to design this slot structure while selecting a bottom layer metal Metal1 as a metal base plate, and stacking intermediate metal layers and metal vias to form a metal shielding cavity around the H-shaped slot structure;

S3: selecting a suitable insulating adhesive layer to combine the rectangular dielectric resonator block and the on-chip H-shaped slot structure;

S4: simulating the on-chip dielectric resonant terahertz antenna by using high frequency structure simulation analysis software.

Preferably, in the S1, the resonance mode of the rectangular dielectric resonator block is selected to be $TE_{1,\delta,3}$ mode of high-order resonant modes, and the transcendental equation is solved by programming with mathematical software Matlab, to obtain the 3D dimensions of the rectangular dielectric resonator block at a frequency of 300 GHz being $W_{DR}$=250 μm, $L_{DR}$=250 μm, $H_{DR}$=400 μm, respectively; in the S2, the dimensions of the H-shaped slot structure are $l_1$=70 μm, $l_2$=220 μm, $w_s$=9.5 μm, $w_1$=15 μm, $w_2$=10 μm, $w_3$=10 μm; and the insulating adhesive layer is selected as a thermal stability insulating adhesive having a relative dielectric constant of 2.4 and a thickness of 10 μm; and the high frequency structure simulation analysis software is HFSS.

Preferably, in the transcendental equation of the S1, $$k_{mn} = \frac{2\pi f_{mn}}{c}, k_x = m\frac{\pi}{L_{DRA}}, k_z = n\frac{\pi}{2H_{DRA}}, \quad (2)$$

$$k_x^2 + k_y^2 + k_z^2 = \varepsilon_r k_{mn}^2$$

The technical solution according to the present disclosure has the following advantages over the prior art.

The technical problem to be solved by the technical solution of the present disclosure is that the on-chip terahertz antenna existing in the existing terahertz detector has large loss, low gain and radiation efficiency, and the like. The technical solution of the present disclosure combines a rectangular dielectric resonator block in $TE_{1,\delta,3}$ mode of high-order resonant modes with low loss characteristics and an on-chip slot feed structure, thereby effectively overcoming the technical problems of low gain and radiation efficiency, and large loss in designing an on-chip terahertz antenna. Compared with the conventional NMOSFET terahertz detectors based on terahertz antennas such as on-chip dipoles and patches, the dielectric resonant antenna based NMOSFET terahertz detector proposed by the present disclosure achieves lower loss for the on-chip terahertz antenna, and higher gain and radiation efficiency for the on-chip terahertz antenna, thereby effectively improving the detection efficiency and detection sensitivity of the NMOSFET terahertz detector.

In addition, the output voltage signal of the technical solution according to the present disclosure is a DC voltage signal, and the magnitude of the DC voltage signal is proportional to the radiation intensity of the terahertz signal, so that the intensity information of the incident terahertz signal can be conveniently obtained according to the magnitude of the output voltage signal of the terahertz detector, ultimately achieving a terahertz detection with high accuracy.

BRIEF DESCRIPTION OF THE DRAWINGS

In order to more clearly illustrate the technical solutions in embodiments of the present disclosure or the prior art, the accompanying drawings needed to be used in the description of the embodiments or the prior art will be briefly described below. Obviously, the accompanying drawings in the following description are only some embodiments of the present disclosure, and other accompanying drawings can be obtained by ordinary persons skilled in the art from the structures illustrated in these accompanying drawings without any inventive efforts.

DESCRIPTION OF THE REFERENCE NUMERALS

| No. | Name | No. | Name |
| --- | --- | --- | --- |
| 1 | First bias voltage | 43 | Rectangular dielectric resonator block |
| 2 | First bias resistor | | |
| 3 | NMOSFET | 44 | Top layer metal |
| 31 | Source | 5 | Matching network |
| 32 | Drain | 51 | First transmission line |
| 33 | Gate | 52 | Second transmission line |
| 4 | On-chip dielectric resonant terahertz antenna | | |
| | | 6 | First DC blocking capacitor |
| | | 7 | Second bias voltage |

-continued

| No. | Name | No. | Name |
|---|---|---|---|
| 41 | On-chip H-shaped slot structure | 8 | Second bias resistor |
| | | 9 | Low noise preamplifier |
| 411 | Left vertical slot | 10 | First resistor |
| 412 | Right vertical slot | 11 | Second resistor |
| 413 | Left side slot | 12 | Second DC blocking capacitor |
| 414 | Right side slot | | |
| 415 | Metal cavity | 13 | Grounding |
| 416 | Bottom layer metal | 14 | Third DC blocking capacitor |
| 42 | Insulating adhesive layer | 15 | Third transmission line |

The implementation, functional features and advantages of the present disclosure will be further described in the light of embodiments with reference to the accompanying drawings.

DETAILED DESCRIPTION

The technical solutions according to the embodiments of the present disclosure are clearly and completely described in the following with reference to the accompanying drawings of the embodiments of the present disclosure. Obviously, the described embodiments are only a part of the embodiments of the present disclosure, and not all the embodiments. All other embodiments obtained by ordinary persons skilled in the art based on the embodiments of the present disclosure without creative efforts are within the scope of the present disclosure.

It should be noted that if there is a directional indication (such as up, down, left, right, front, back, . . . ) mentioned in the embodiments of the present disclosure, the directional indication is only used to explain the relative positional relationship between components, motion status, and the like in a specific posture (as shown in the drawing), and if the specific posture changes, the directional indication also changes accordingly.

In addition, if there is a description of "first", "second", etc. in the embodiments of the present disclosure, the description of the "first", "second", etc. is used for the purpose of illustration only, and is not to be construed as an its relative importance or implicit indication of the number of technical features indicated. Thus, the features defined by "first" or "second" may include at least one of the features, either explicitly or implicitly. In addition, the technical solutions among the various embodiments may be combined with each other, but must be based on the enablement of those skilled in the art, and when the combination of the technical solutions is contradictory or impossible to implement, it should be considered that such combination of the technical solutions does not exist, and is not within the scope of protection claimed by the present disclosure.

The present disclosure proposes a dielectric resonant antenna based NMOSFET terahertz detector and a design method for the on-chip dielectric resonant terahertz antenna.

Figure 1:
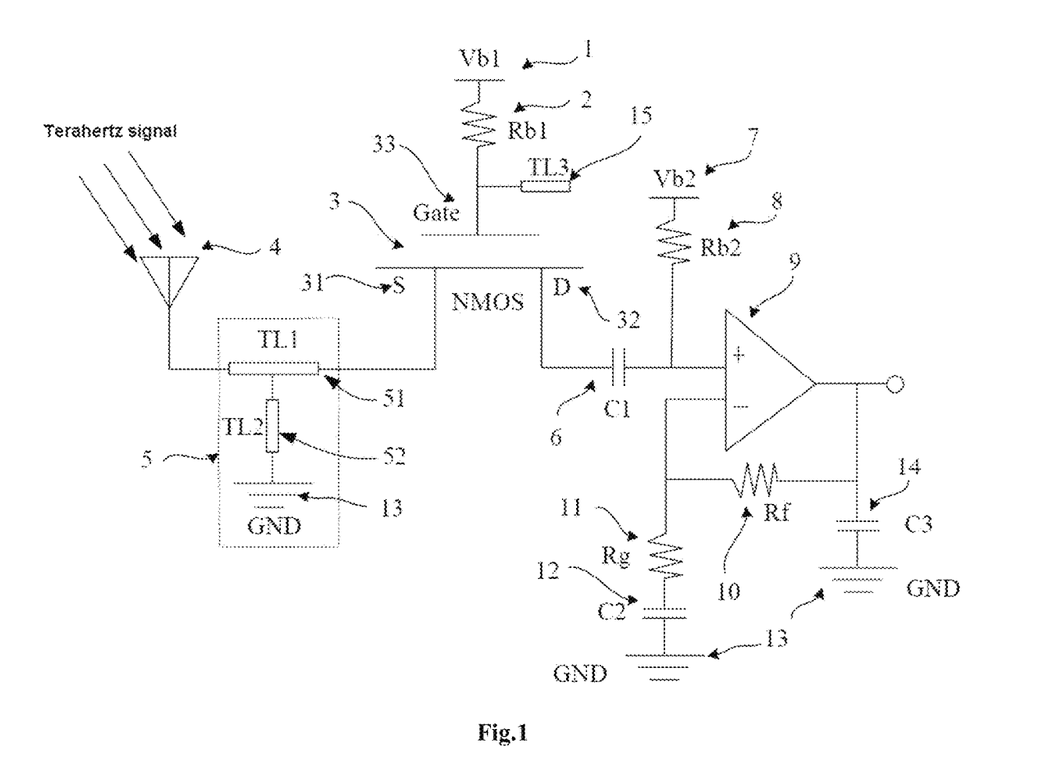
FIG. 1 is a schematic structural view of a dielectric resonant antenna based NMOSFET terahertz detector according to the present disclosure.

Referring to FIG. 1, in an embodiment of the present disclosure, the dielectric resonant antenna based NMOSFET terahertz detector comprises an on-chip dielectric resonant terahertz antenna 4. The on-chip dielectric resonant terahertz antenna 4 is connected to a matching network 5, and the matching network 5 is further connected to a source 31 of an NMOSFET 3. A gate 33 of the NMOSFET 3 is sequentially connected to a first bias resistor 2 and a first bias voltage 1. An open-end quarter-wavelength third transmission line 15 is connected between the gate 33 and the first bias resistor 2. A drain 32 of the NMOSFET 3 is connected to a first DC blocking capacitor 6, and the other end of the first DC blocking capacitor 6 is connected to a low noise preamplifier 9. A second bias resistor 8 is connected between the first DC blocking capacitor 6 and the low noise preamplifier 9, and the other end of the second bias resistor 8 is connected to the first bias voltage 7 so as to provide a DC power supply to the low noise preamplifier 9. In addition, the low noise preamplifier 9 is also connected to a voltage feedback loop.

Figure 2:
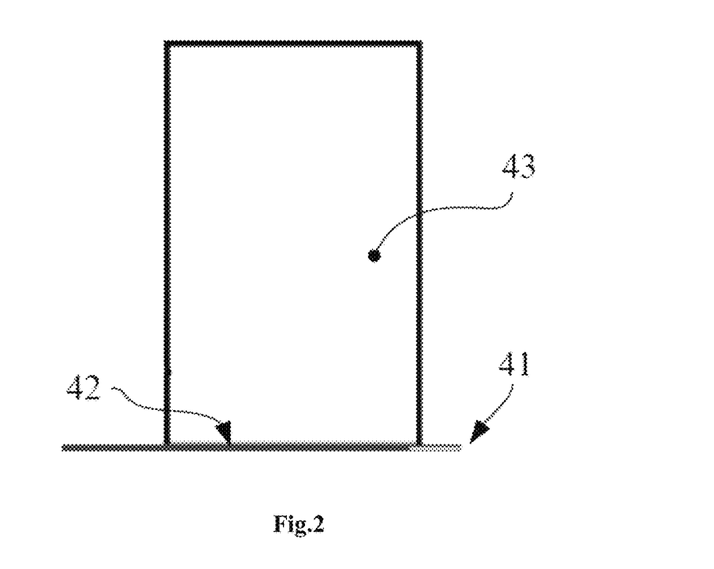
FIG. 2 is a schematic structural view of an on-chip dielectric resonant terahertz antenna according to the present disclosure.
Figure 3:
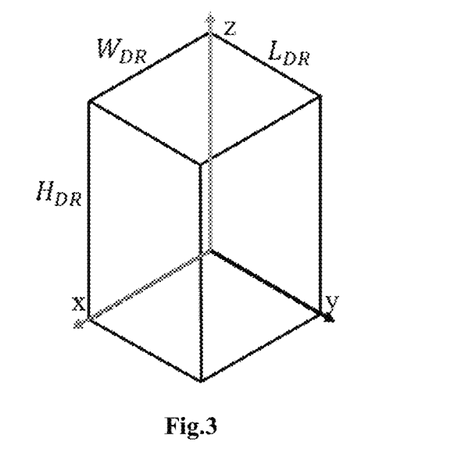
FIG. 3 is a schematic structural view of a rectangular dielectric resonator block according to the present disclosure.
Figure 4:
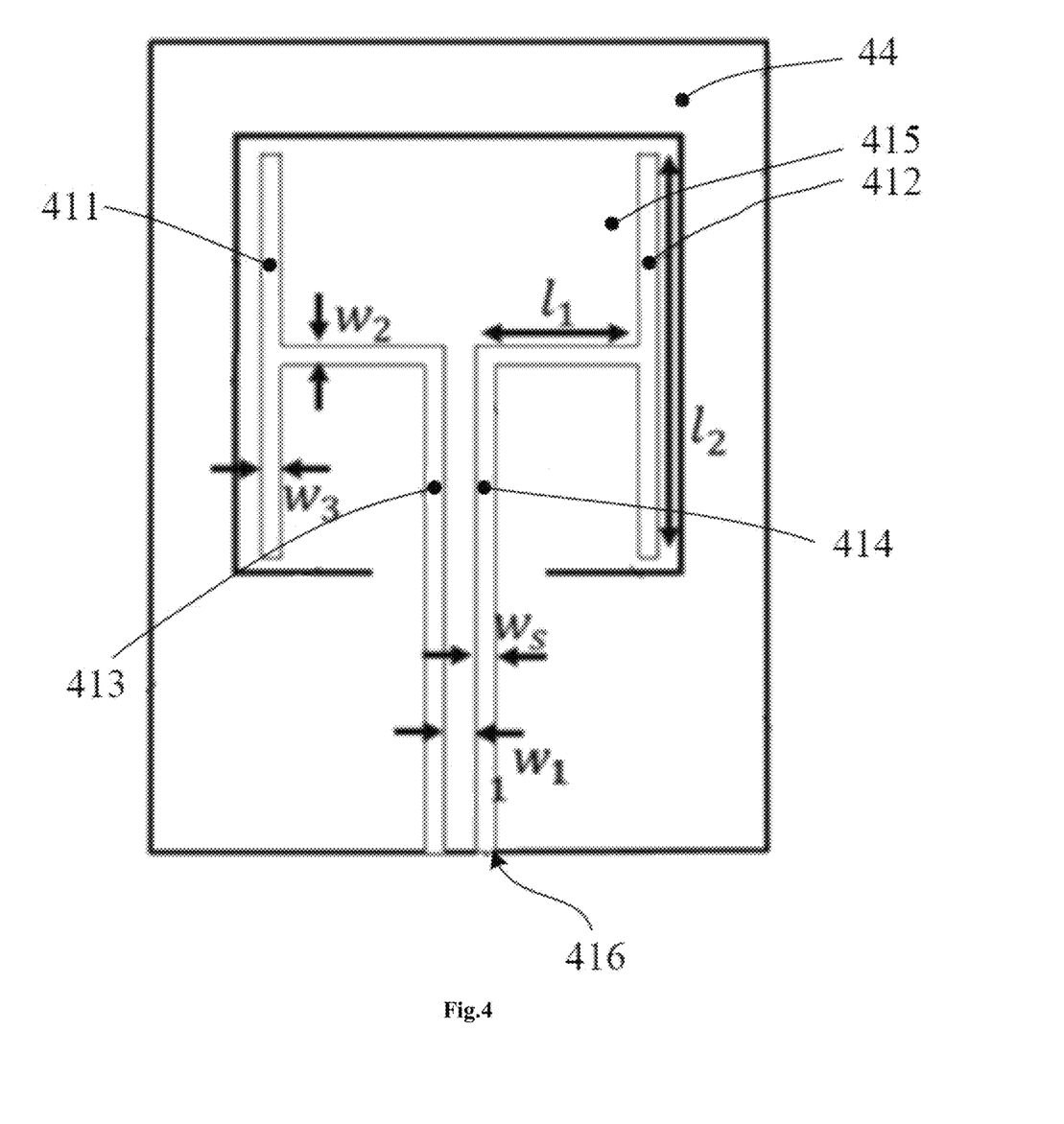
FIG. 4 is a schematic structural view of an on-chip H-shaped slot structure according to the present disclosure.

Referring to FIG. 2 to FIG. 4, specifically, the on-chip dielectric resonant terahertz antenna 4 of the present embodiment comprises an on-chip H-shaped slot structure 41 and a rectangular dielectric resonator block 43, and the rectangular dielectric resonator block 43 is disposed on a surface of the on-chip H-shaped slot structure 41 through the insulating adhesive layer 42. The on-chip H-shaped slot structure 41 of the present embodiment is formed on a surface of an integrated process top layer metal 44 and is located within a metal cavity 415 formed by stacking intermediate layer metals, other than the integrated process top layer metal 44 and an integrated process bottom layer metal 416 in an integrated process, and metal vias.

Referring to FIG. 4, more specifically, the on-chip H-shaped slot structure 41 of the present embodiment comprises a left vertical slot 411 and a right vertical slot 412 arranged in parallel, opposite sides of the left vertical slot 411 and the right vertical slot 412 are connected to an inverted L-shaped left side slot 413 and right side slot 414, respectively, a horizontal portion of the left side slot 413 is connected in the middle of the left vertical slot 411, and a horizontal portion of the right side slot 414 is connected in the middle of the right vertical slot 412. Additionally, vertical portions of the left side slot 413 and the right side slot 414 are parallel to each other and constitute two lead-out slots for connecting the antenna to an outside structure.

Preferably, the on-chip H-shaped slot structure 41 of the present embodiment is designed and processed using a silicon-based process so as to excite the rectangular dielectric resonator block 43 overlying it and optimize the impedance matching effect. In addition, the insulating adhesive layer 42 has good thermal stability for fixing the rectangular dielectric resonator block 43 to a surface of the on-chip excitation structure.

More preferably, the rectangular dielectric resonator block 43 of the present embodiment has a larger relative dielectric constant, for example, a relative dielectric constant of >5, so that the insulating material is processed into a specific size to couple and radiate an electromagnetic field to the space. In addition, the rectangular dielectric resonance mode of the present embodiment is a $TE_{1,\delta 3}$ mode. In this embodiment, the center frequency of the on-chip dielectric resonant terahertz antenna 4 is 300 GHz, and magnesium oxide having a relative dielectric constant of 9.65 is selected as the material of the rectangular dielectric resonator block. A parameter (Towerjazz SBC18H3) of the 0.18mGeSi BiCMOS process is selected to design the on-chip structure, and there are six layers of metal Metal1-Metal6 and five layers of metal vias Via1-Via5 in this process.

The matching network 5 of the present embodiment is composed of two microstrip transmission lines, the first transmission line 51 and the second transmission line 52. The matching network 5 is mainly used to improve the power transmission efficiency between the antenna and the transistor, and a DC power supply is provided for the source (S) of the transistor. The left end of the microstrip first transmission line 51 is connected to the on-chip dielectric resonant terahertz antenna 4, and the right end of the microstrip first transmission line 51 is connected to the source 31 of the NMOSFET 3.

The gate 33 of the NMOSFET 3 of the present embodiment is loaded with a fixed first bias voltage 1 and a first bias resistor 2, and an open-end quarter-wavelength third transmission line 53 is connected between the gate 33 of the NMOSFET and the first bias resistor 2. The open-end quarter-wavelength third transmission line 53 is mainly used to eliminate the influence of the gate DC bias on the impedance matching between the antenna and the transistor.

In the present embodiment, a first DC blocking capacitor 6, a second bias voltage 7, and a second bias resistor 8 are connected between the drain 32 of the NMOSFET 3 and the forward input terminal of the low noise preamplifier 9, wherein the second bias voltage 7 and the second bias resistor 8 are used for supplying power to the low noise preamplifier 9.

The voltage feedback loop of the low noise preamplifier 9 of the present embodiment is mainly composed of the first resistor 10, the second resistor 11, the second DC blocking capacitor 12 and the third DC blocking capacitor 14, wherein the gain of the low noise preamplifier 9 can be adjusted by changing the resistance values of the first resistor 10 and the second resistor 11.

Referring to FIG. 1 to FIG. 7, the design of the on-chip dielectric resonant terahertz antenna specifically comprises the following design steps.

1. Design of rectangular dielectric resonator block 43. The resonant mode is in $TE_{1,\delta,n}$ mode, and the dimensions of the rectangular dielectric resonator block 43 as shown in FIG. 3 can be calculated by solving the transcendental equation (1):

$$k_y \tan\left(\frac{k_y W_{DRA}}{2}\right) = \sqrt{(\varepsilon_r - 1)k_{mn}^2 - k_y^2} \quad (1)$$

$$k_{mn} = \frac{2\pi f_{mn}}{c}, k_x = m\frac{\pi}{L_{DRA}}, k_z = n\frac{\pi}{2H_{DRA}}, \quad (2)$$

$$k_x^2 + k_y^2 + k_z^2 = \varepsilon_r k_{mn}^2$$

where Equations (2) is the explanation for parameters of the equation (1), wherein c is the speed of light, and $f_{mn}$ is the operating frequency of the rectangular dielectric resonator block in this mode. The $TE_{1,\delta,3}$ mode of high-order resonant modes is selected as the resonant mode of the rectangular dielectric resonator block 43 in the embodiment of the present disclosure, and has a higher gain than the base mode. The transcendental equation (1) is solved by programming with the mathematical software Matlab, obtaining the dimensions of the rectangular dielectric resonator block 43 at 300 GHz as: $W_{DR}$=250 μm, $L_{DR}$=250 μm, $H_{DR}$=400 μm.

2. Design of on-chip excitation structure. The on-chip H-shaped slot structure 41 is shown in FIG. 4. In the design process, the top layer metal Metal6 is selected to design the slot structure, while the bottom layer metal Metal1 is selected as the metal base plate to suppress the electromagnetic wave from propagating toward a high-loss silicon substrate, and the intermediate metal layer and metal vias are stacked to form a metal shield cavity around the H-shaped slot structure, to suppress electromagnetic leakage and reduce loss.

The dimension parameters of the H-shaped slot structure are:

$l_1$=70 μm, $l_2$=220 μm, $w_s$=9.5 μm, $w_1$=15 μm, $w_2$=10 μm, $w_3$=10 μm

3. Selection of the insulating adhesive layer 42. The insulating adhesive layer 42 is made of a thermally stable insulating adhesive having a relative dielectric constant of 2.4 and a thickness of 10 μm, for bonding the rectangular dielectric resonator block 43 and the on-chip H-shaped slot structure 41.

Figure 5:
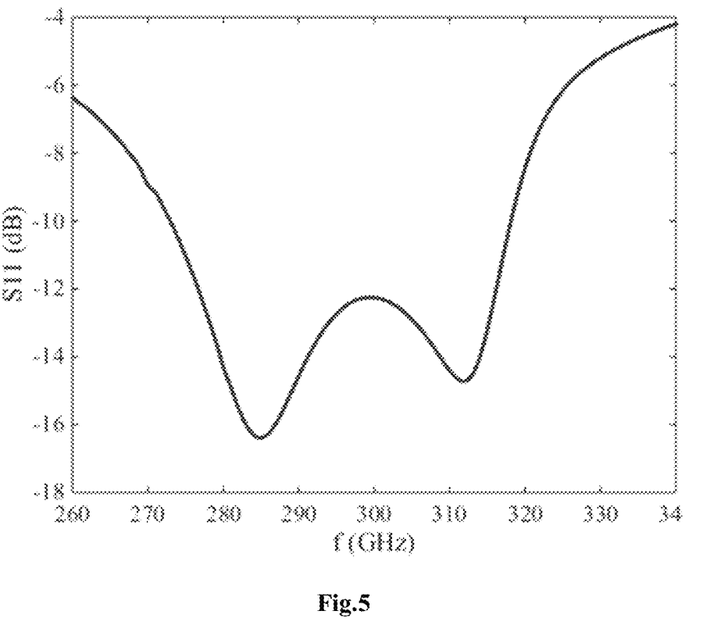
FIG. 5 is a graph showing the return loss S11 of an on-chip dielectric resonant terahertz antenna according to the present disclosure as a function of frequency.
Figure 6:
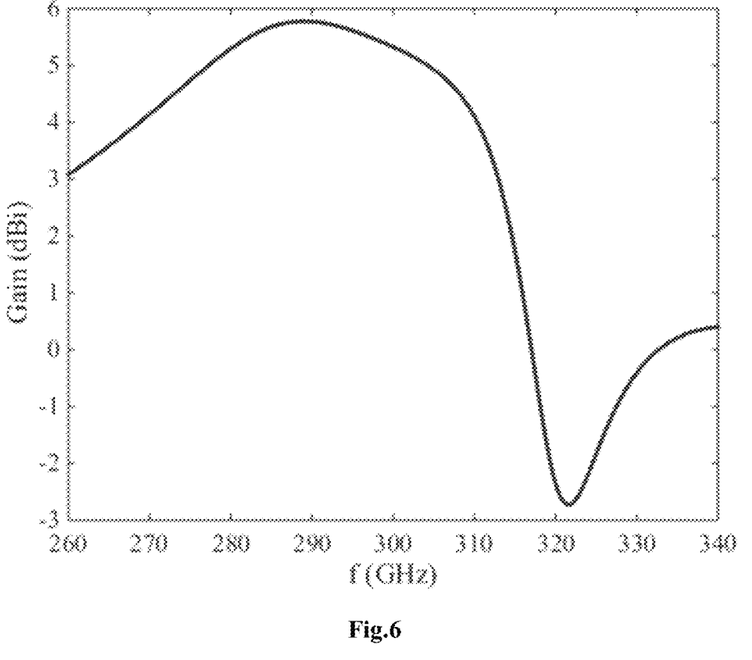
FIG. 6 is a graph showing the gain of an on-chip dielectric resonant terahertz antenna according to the present disclosure as a function of frequency.
Figure 7:
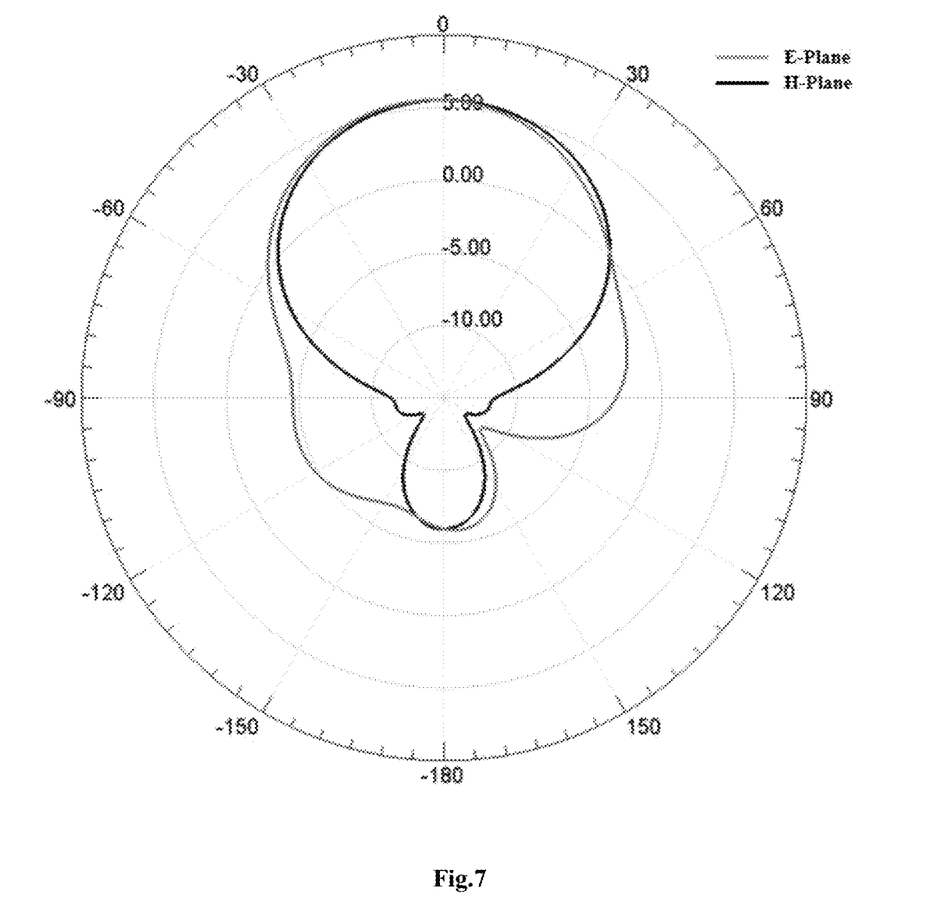
FIG. 7 is a radiation pattern of an on-chip dielectric resonant terahertz antenna according to the present disclosure.

4. Simulating the on-chip dielectric resonant terahertz antenna by using high frequency structure simulation analysis software (HFSS). FIG. 5 shows the return loss S11 of the on-chip dielectric resonant terahertz antenna 4 as a function of frequency, where the impedance matching bandwidth of the on-chip dielectric resonant terahertz antenna array at −10 dB is 15.2% (273-318 GHz). FIG. 6 shows the gain of the on-chip dielectric resonant terahertz antenna 4 as a function of frequency, where the peak gain of the on-chip dielectric resonant terahertz antenna 4 is 5.77 dBi and the gain bandwidth at 3 dB is 13.7% (270-310 GHz). The radiation pattern of the on-chip dielectric resonant terahertz antenna is shown in FIG. 7, where the radiation efficiency of the dielectric resonant antenna is 71%.

The output voltage signal of the dielectric resonant antenna based NMOSFET terahertz detector of the technical solution according to the present disclosure is a DC voltage signal, and the magnitude of the DC voltage signal is proportional to the radiation intensity of the terahertz signal, so that the intensity information of the incident terahertz signal can be obtained according to the magnitude of the output voltage signal of the terahertz detector, thereby realizing terahertz detection.

The above is only a preferred embodiment of the present disclosure, which is not intended to limit the scope of the disclosure. All equivalent structural alterations made by using the disclosure of the present specification and drawings, or directly or indirectly utilized in other related technical fields, in the concept of the present disclosure, are encompassed within the scope of patent protection of the present disclosure.

What is claimed is:

1. A dielectric resonant antenna based N-type Metal-Oxide-Semiconductor Field-Effect Transistor (NMOSFET) terahertz detector comprising an on-chip dielectric resonant terahertz antenna, wherein the on-chip dielectric resonant terahertz antenna is connected to a matching network, the matching network is connected to a source of an NMOSFET, wherein the matching network comprises a first transmission line connected to the on-chip dielectric resonant terahertz antenna and the source respectively at both ends, a middle portion of the first transmission line is connected to one end of a second transmission line, and the other end of the second transmission line is grounded, wherein a gate of the NMOSFET is sequentially connected to a first bias resistor and a first bias voltage, a third transmission line is connected between the first bias resistor and the gate, a drain of the NMOSFET is connected to a first Direct Current (DC) blocking capacitor, the other end of the first DC blocking capacitor is connected to a low noise preamplifier, a second bias resistor and a second bias voltage are further connected in parallel between the first DC blocking capacitor and the low noise preamplifier, and the low noise preamplifier is further provided with a voltage feedback loop.

2. The dielectric resonant antenna based NMOSFET terahertz detector of claim 1, wherein the on-chip dielectric resonant terahertz antenna comprises an on-chip H-shaped slot structure and a rectangular dielectric resonator block connected to the on-chip H-shaped slot structure at the surface by an insulating adhesive layer.

3. The dielectric resonant antenna based NMOSFET terahertz detector of claim 2, wherein the on-chip H-shaped slot structures are formed on a surface of an integrated process top layer metal and is located within a metal cavity formed by stacking intermediate layer metals, other than the integrated process top layer metal and an integrated process bottom layer metal in an integrated process, and metal vias.

4. The dielectric resonant antenna based NMOSFET terahertz detector of claim 3, wherein the on-chip H-shaped slot structure comprises a left vertical slot and a right vertical slot arranged in parallel, opposite sides of the left vertical slot and the right vertical slot are connected to an inverted L-shaped left side slot and right side slot, respectively.

5. The dielectric resonant antenna based NMOSFET terahertz detector of claim 4, wherein a horizontal portion of the left side slot is connected in the middle of the left vertical slot, a horizontal portion of the right side slot is connected in the middle of the right vertical slot, and vertical portions of the left side slot and the right side slot are parallel to each other and constitute two lead-out slots for connecting the antenna to an outside structure.

6. The dielectric resonant antenna based NMOSFET terahertz detector of claim 1, wherein the voltage feedback loop comprises a first resistor connected to two ends of the low noise preamplifier, a left end of the first resistor connected to a negative terminal of the low noise preamplifier is sequentially connected to a second resistor, a second DC blocking capacitor and the ground, and a right end of the first resistor is also sequentially connected to a third DC blocking capacitor and the ground.

\* \* \* \* \*